(12) United States Patent
Sotiriou (10) Patent No.: US 7,861,130 B2
(45) Date of Patent: *Dec. 28, 2010

(54) SYSTEM AND METHOD OF DETERMINING THE SPEED OF DIGITAL APPLICATION SPECIFIC INTEGRATED CIRCUITS

(75) Inventor: Christos P. Sotiriou, Crete (GR)

(73) Assignee: Institute of Computer Science, Foundation for Research and Technology-Hellas, Heraklion (GR)

( * ) Notice: Subject to any disclaimer, the term of this patent is extended or adjusted under 35 U.S.C. 154(b) by 1047 days.

This patent is subject to a terminal disclaimer.

(21) Appl. No.: 11/330,350

(22) Filed: Jan. 12, 2006

(65) Prior Publication Data

US 2006/0217919 A1 Sep. 28, 2006

(51) Int. Cl.
*G01R 31/28* (2006.01)
*G06F 11/00* (2006.01)

(52) U.S. Cl. ...................... 714/731; 714/744
(58) Field of Classification Search ................ 714/724, 714/726, 729, 731, 734, 744
See application file for complete search history.

(56) References Cited

U.S. PATENT DOCUMENTS

| | | | |
|---|---|---|---|
| 4,686,392 A | 8/1987 | Lo | |
| 5,250,856 A | 10/1993 | Burton et al. | |
| 5,305,463 A | 4/1994 | Fant et al. | |
| 5,583,875 A * | 12/1996 | Weiss | 714/745 |
| 5,630,110 A * | 5/1997 | Mote, Jr. | 713/501 |
| 5,774,367 A * | 6/1998 | Reyes et al. | 716/2 |
| 5,845,109 A | 12/1998 | Suzuki et al. | |
| 5,870,404 A * | 2/1999 | Ferraiolo et al. | 714/700 |
| 6,043,674 A | 3/2000 | Sobelman | |
| 6,075,389 A | 6/2000 | Umemoto et al. | |
| 6,088,830 A | 7/2000 | Blomgren et al. | |
| 6,133,761 A | 10/2000 | Matsubara | |
| 6,185,712 B1 * | 2/2001 | Kirihata et al. | 714/732 |
| 6,349,387 B1 | 2/2002 | Blomgren | |
| 6,509,761 B2 | 1/2003 | Taki | |
| 6,526,542 B2 | 2/2003 | Kondratyev | |
| 6,807,509 B2 | 10/2004 | Bourdin et al. | |
| 6,819,150 B1 | 11/2004 | Santosa et al. | |
| 6,891,410 B2 | 5/2005 | Sadowski | |
| 6,964,003 B2 | 11/2005 | Thibeault | |

(Continued)

OTHER PUBLICATIONS

PCT Search Report, 2007.

(Continued)

*Primary Examiner*—Cynthia Britt
(74) *Attorney, Agent, or Firm*—Steptoe & Johnson LLP (57) ABSTRACT

According to an embodiment of the invention, a system for identifying when a running speed of an integrated circuit is within an applied clock speed is provided. A monotonic circuit is configured to receive input data and transmit output data. A completion detection circuit is configured to generate a completion detection signal for the monotonic circuit. A comparator is configured to compare at least the completion detection signal and a clock signal, and configured to emit an error signal if the clock signal arrives before the completion detection signal. A synchronous circuit element is configured to receive at least a portion of the output data and configured to be clock driven by the clock signal. The error signal represents that the clock speed is faster than an operating speed of the monotonic circuit.

15 Claims, 5 Drawing Sheets

U.S. PATENT DOCUMENTS

| | | | |
|---|---|---|---|
| 7,017,094 | B2* | 3/2006 | Correale et al. ............. 714/733 |
| 7,269,805 | B1* | 9/2007 | Ansari et al. ................... 716/4 |
| 7,318,003 | B2* | 1/2008 | Sotiriou ...................... 702/125 |
| 2004/0025123 | A1* | 2/2004 | Angilivelil ...................... 716/4 |
| 2004/0103355 | A1* | 5/2004 | Correale et al. ............. 714/733 |

OTHER PUBLICATIONS

I. Blunno, J. Cortadella, A. Kondratyev, L. Lavagno, K. Lwin, and C. Sotiriou. Handshake Protocols for De-Synchronization. In *Proc. International Symposium on Advanced Research in Asynchronous Circuits and Systems*, pp. 149-158, IEEE Computer Society Press, Apr. 2004.

User Guide. In *Celtic User Manual, Cadence Design Systems, Inc.*, 2004.

D. Chinnery and K. Keutzer. Reducing the Timing Overhead. In *Closing the Gap between ASIC and Custom*: Tools And Techniques For High-Performance ASIC Design, chapter 3. Kluwer Academic Publishers, 2002.

J. Cortadella, A. Kondratyev, L. Lavagno, and C. Sotiriou. Coping with the Variability of Combinational Logic Delays. In *Proc. International Conf. Computer Design (ICCD)*, Oct. 2004.

S. Devadas and K. Keutzer. Synthesis of Robust Delay-Fault Testable Circuits: Theory. *IEEE Transactions on Computer-Aided Design*, 11(1):87-101, Jan. 1992.

Y. Kukimoto, R.K. Brayton, and P. Sawkar. Delay-Optimal Technology Mapping by DAG Covering. In *Design Automation Conference*, pp. 348-351, 1998.

Alex Kondratyev and Kelvin Lwin. Design of Asynchronous Circuits by Synchronous CAD Tools. In *Proc. ACM/IEEE Design Automation Conference*, Jun. 2002.

D. S. Kung. Hazard-Non-Increasing Gate-Level Optimization Algorithms. In *Proc. International Conf. Computer-Aided Design (ICCAD)*, pp. 631-634, 1992.

E. Lehman, Y. Watanabe, J. Grodstein, and H. Harkness. Logic Decomposition During Technology Mapping. *IEEE Transactions On Computer-Aided Design*, 16(8):813-834, Aug. 1997.

S.R Nassif. Modeling and Forecasting of Manufacturing Variations, Proceedings of the ASP-DAC 2001 *Asia And South Pacific Design Automation Conference*, Jan. 30-Feb. 2, 2001, pp. 145-149.

R. Puri, A. Bjorksten, and T. Rosser. Logic Optimization by Output Phase Assignment in Dynamic Logic Synthesis. In *Proc. International Conf. Computer-Aided Design (ICCAD)*, pp. 2-8, 1996.

M. Prasad, D. Kirkpatrick, R.Brayton, and A. Sangiovanni Vincentelli. Domino. Logic Synthesis And Technology Mapping. In *Proc. International Workshop on Logic Synthesis*, vol. 1, 1997.

Jens Sparsø and Jørgen Staunstrup. Delay-Insensitive Multi-Ring Structures. *Integration, the VLSI journal*, 15(3):313-340, Oct. 1993.

E. M. Sentovich, K. J. Singh, L. Lavagno, C. Moon, R. Murgai, A. Saldanha, H. Savoj, P. R. Stephan, R. K. Brayton, and A. Sangiovanni-Vincentelli. SIS: A System for Sequential Circuit Synthesis. Technical report, U.C. Berkeley, May 1992.

Ivan E. Sutherland. Micropipelines. *Communications of the ACM*, 32(6):720-738, Jun. 1989.

M. A. Thornton, K. Fazel, R. B. Reese, and C. Traver. Generalized Early Evaluation in Self-Timed Circuits. In *Proc. Design, Automation and Test in Europe (DATE)*, pp. 255-259, Mar. 2002.

S. H. Unger. Asynchronous Sequential Switching Circuits. Wiley-Interscience, John Wiley & Sons, Inc., New York, 1969.

Victor I. Varshavsky, editor. *Self-Timed Control of Concurrent Processes*: The Design of Aperiodic Logical Circuits in Computers and Discrete Systems. Kluwer Academic Publishers, Dordrecht, The Netherlands, 1990, Chapters 3 and 4.

R. K. Brayton et al, Multilevel Logic Synthesis, Proceedings of the IEEE, vol. 78, No. 2, Feb. 1990.

* cited by examiner

SYSTEM AND METHOD OF DETERMINING THE SPEED OF DIGITAL APPLICATION SPECIFIC INTEGRATED CIRCUITS

CROSS-REFERENCE TO RELATED APPLICATIONS

The present application relates to U.S. patent application Ser. No. 11/283,070, filed on Nov. 21, 2005, and U.S. patent application Ser. No. 11/315,309 filed on Dec. 15, 2005, both of which claim priority to U.S. Provisional Patent Application Ser. No. 60/642,990, filed on Jan. 12, 2005, the disclosures of which are expressly incorporated by reference herein in their entireties.

BACKGROUND OF THE INVENTION

1. Field of the Invention

The present invention relates to determining the running speed of an integrated circuit. More specifically, the present invention relates to an integrated circuit that receives clock signal and which generates an error signal when the clock signal exceeds the overall speed of the integrated circuit.

2. Discussion of Background Information

Integrated circuits made according to the same manufacturing process are typically not created equal. Due to various imperfections in the manufacturing process from one lot of chips to the next, and even with the same lots, individual chips (IC) may have different running speeds. The computing market has been able to take advantage of this manufacturing flaw by charging more for faster chips and less for slower chips. This market segmentation requires sorting the chips into different speed classifications.

It is common to identify timing bins with two or more clock speed reference points for the ICs operation. For example, a fast bin for chips which operate faster than expected, a nominal bin for chips that operate at the expected speed, and a slow bin for chips that operate slower than expected. A practical example is the Pentium 4 processor chip, whereby the same manufactured circuit is binned at steps of 200 MHz, e.g., 2.8 GHz goes into the fast bin and will be the most expensive chips with the lowest timing yield, 2.6 GHz goes into the nominal bin and will be cheaper than the 2.8 GHz chip, and 2.4 GHz chips will go to the slow bin and be the cheapest of the three. Another example is the Intel Centrino processor with speed bins at 1.1 GHz, 1.2 GHz and 1.5 GHz.

Currently manufactured IC's do not have the ability to communicate their running speed. Empirical methods are used in that the same IC is tested repeatedly at different speeds to determine if the chip works reliably or not at that speed. Thus for example, an IC which operates reliably and consistently when tested at 2.4 GHz but erratically or not at all at 2.6 GHz indicates that the chips' actual speed is somewhere between 2.4 and 2.6 GHz. The chip could be accepted as a 2.4 GHz chip, or tested to further narrow its operating range (e.g., whether the chip works reliably between 2.4 and 2.5 GHz). Ultimately the chip is labeled at a speed of the lower of the selected range, as opposed to its actual running speed. It is therefore not uncommon for chips to be able to operate faster than their advertised running speed. It is also not uncommon for users to modify their system to "overclock" their PC to access the additional speed potential.

SUMMARY OF THE INVENTION

Other exemplary embodiments and advantages of the present invention may be ascertained by reviewing the present disclosure and the accompanying drawings.

According to an embodiment of the invention, a system for identifying when a running speed of an integrated circuit is within an applied clock speed is provided. A monotonic circuit is configured to receive input data and transmit output data. A completion detection circuit is configured to generate a completion detection signal for the monotonic circuit. A comparator is configured to compare at least the completion detection signal and a clock signal, and configured to emit an error signal if the clock signal arrives before the completion detection signal. A synchronous circuit element is configured to receive at least a portion of the output data and configured to be clock driven by the clock signal. The error signal represents that the clock speed is faster than an operating speed of the monotonic circuit.

The above embodiment may have various features. The synchronous circuit element may be a flip-flop or a latch. The monotonic circuit may be an asynchronous multi-rail circuit. The monotonic circuit may have a critical path, wherein a running speed of the monotonic circuit is at a minimum when a critical input vector is applied to the monotonic circuit.

The monotonic circuit may include first and second monotonic circuits. The completion detection circuit may include at least first and second completion detection circuits configured to generate at least first and second completion detection signals for the at least first and second monotonic circuits, respectively. The comparator may comprise at least first and second comparators configured to compare at least the first and second completion detection signals with the clock signal, and configured to emit an error signal if the clock signal arrives before the at least first or second completion detection signal, respectively. The at least first and second monotonic circuits contain at least one critical path, wherein the running speed is at a minimum in response to a critical input vector under ambient external conditions.

According to another embodiment of the invention, a method for determining a minimum running speed of an integrated circuit is provided. At least one critical path in the integrated circuit is identified. At least one critical test vector is selected for each of the at least one critical path. The at least one critical test vector is input to the circuit under ambient conditions. At least one clock speed is applied for each of the at least one critical input vector applied during the inputting. During applying, the integrated circuit is monitored for the presence of an error signal. The fastest individual clock speed from the at least one clock speed that did not generate the error signal is identified during the monitoring.

The above embodiment may have various features the ambient external conditions may be modified to thereby change the speed of the integrated circuit. The modification may include changing the voltage of the power supply applied to the circuit or the temperature of the circuit. A plurality of speed ranges may be established the fastest individual clock speed of the circuit is compared with the plurality of speed ranges to identify a corresponding speed range, the circuit is sorted based on the corresponding speed range identified by the comparing.

BRIEF DESCRIPTION OF THE DRAWINGS

The present invention is further described in the detailed description which follows, in reference to the noted plurality of drawings by way of non-limiting examples of certain embodiments of the present invention, in which like numerals represent like elements throughout the several views of the drawings, and wherein.

DETAILED DESCRIPTION OF THE EXEMPLARY EMBODIMENT

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Figure 1:
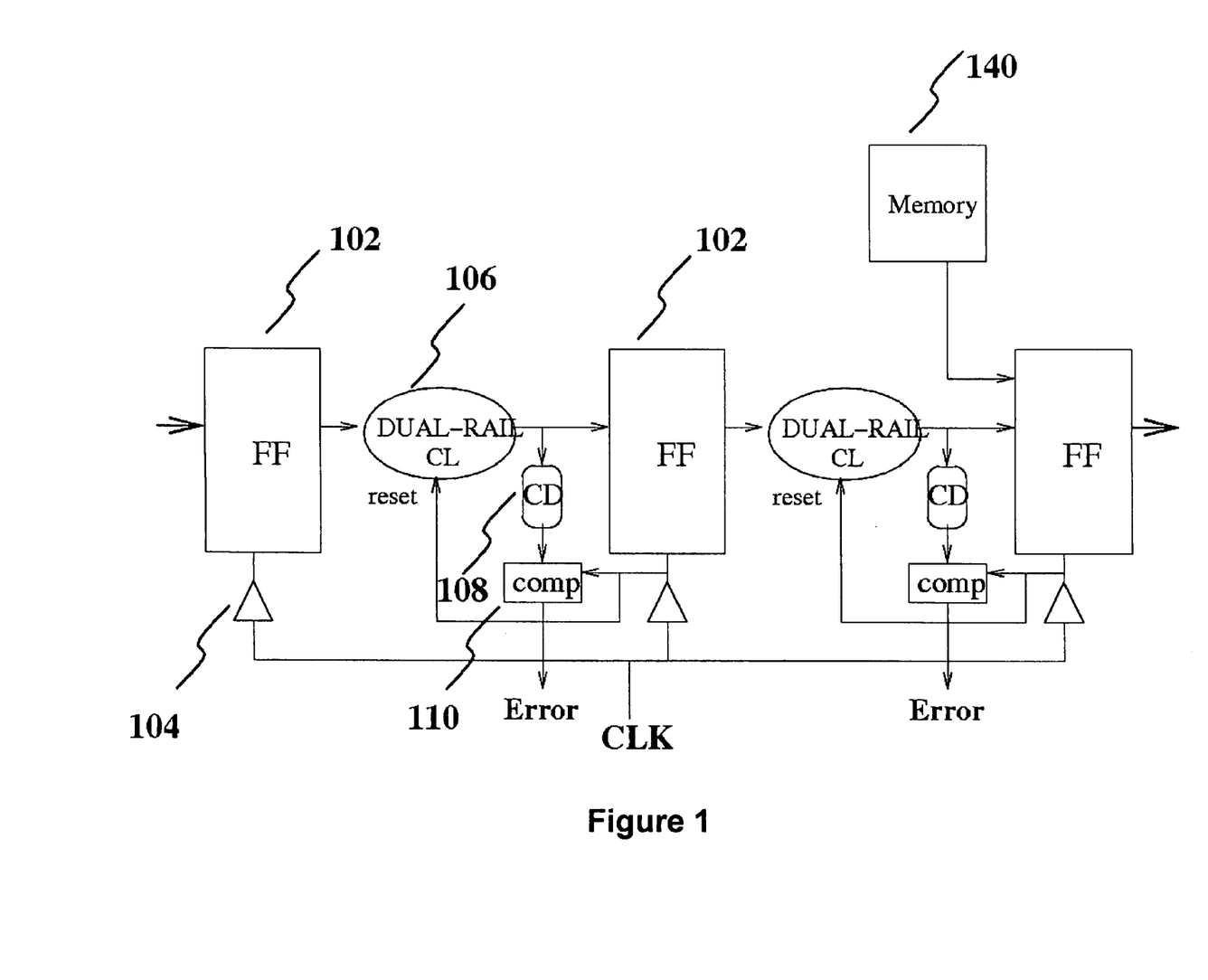
FIG. 1 illustrates a block diagram of an embodiment of the invention in a linear pipeline configuration.

Referring now to FIG. 1, an embodiment of the invention is shown in a linear pipeline structure collectively as circuit 100. A flip-flop 102 (which may be a latch) receives input data from an upstream source. The data passes to a circuit cloud 106, which process the input data into one or more output signals. The output signals then pass to the next flip-flop 102 in the pipeline and to completion detection circuitry 108. Each flip flop 102 is clock driven by an applied clock signal 112 through buffers 104. The overall speed of circuit 100 will be set by the clock speed of the applied clock signal 112.

The circuitry within circuit cloud 106 will initially be unstable as different input signals travel along different paths and reach the outputs at different times, often causing incorrect output signals. Eventually each circuit cloud 106 will complete its processing to the point that its output signal(s) will stabilize (e.g., because the circuit will complete processing or where any remaining processing will not effect the outputs). Completion detection circuitry 108 monitors the processing state of circuit cloud 106 and generates a completion detection signal when the outputs of circuit cloud 106 achieve this stable state.

For proper timing, any particular flip flop 102 should not propagate the output signal of the upstream circuit cloud 106 before the completion detection signal is generated and the flip-flop has sufficient time to settle its outputs. Comparators 110 therefore compare the completion detection signals with the active edge of the clock signal 112 during the DATA phase of every clock cycle. In proper operation, the clock signal arrives after the completion detection signal by at least the flip-flop set-up time, then the comparator keeps its output low. However, if the clock signal arrives before the completion detection signal, or before the flip-flop set-up time elapses after the completion signal, then the clock speed is too fast for circuit 100. The output of the corresponding comparator 110 goes HIGH, which represents a timing error signal 114.

Figure 3:
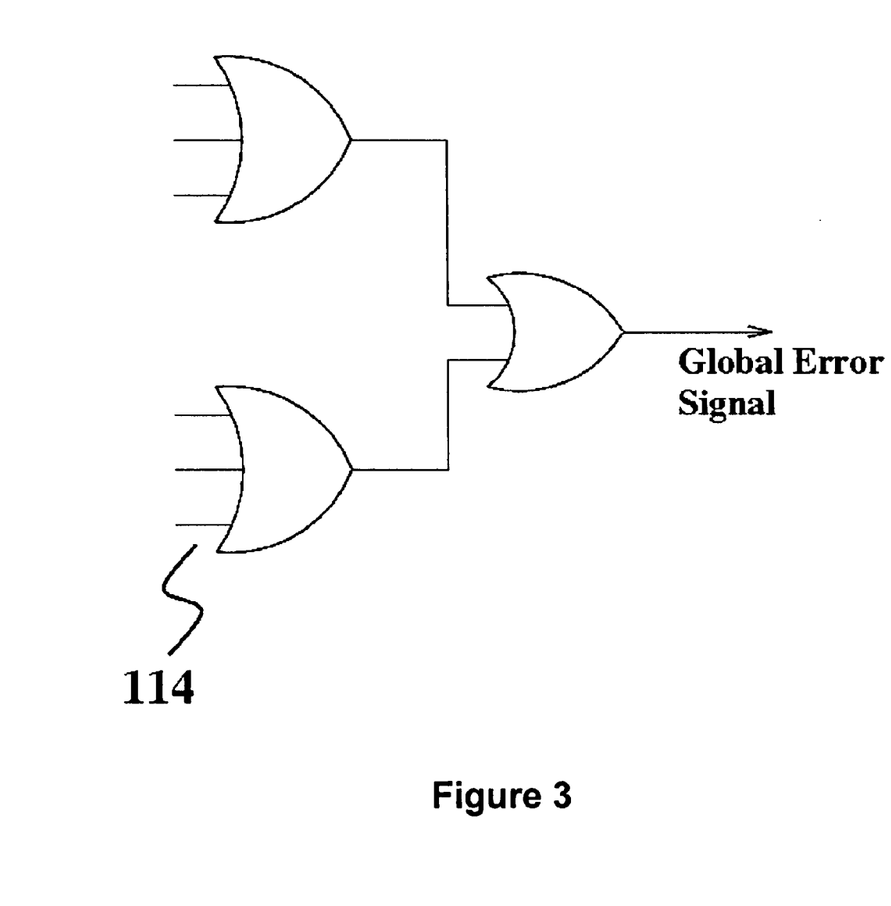
FIG. 3 illustrates an OR gate configuration from receiving inputs from multiple comparators to generate a global error signal.

The presence of a timing error signal 114 from any comparator 108 constitutes a global error signal for the entire circuit 100. Circuitry is therefore provided to generate a master timing error signal for circuit 100. For circuit 100, an OR gate or network of OR gates that receives all of the outputs from comparators 110 is sufficient for this purpose. FIG. 3 shows a non-limiting example of such a configuration. The invention is not so limited however, and any circuitry which generates the global error signal is acceptable.

The presence of the error signal represents that the most recent cycle of data processing did not produce a valid output and must be reprocessed, but at a lower clock speed. A memory 140 preferably stores at least the state of the last round of input vectors so that they can be reapplied. The clock speed can be set slow either by decreasing the prior clock speed by a fixed amount of fixed percentage. In the alternative, memory 140 may contain a look up table of acceptable clock speeds, either preset in memory and/or the clock speeds that operated properly for other data processing cycles.

The embodiment may be used to determine the actual running actual running speed of circuit 100. While the speed of the integrated circuit may change based on the inputs, for purpose of marketing and sales it may nonetheless be desirable to know the minimum operating speed of the chip. The minimum operating speed would be the overall clock speed of circuit 100 under a worst-case scenario in which a particular input vector causes a particular circuit cloud(s) 106 to take the longest amount of time to process the input vector compared to the amount of time that it would take for any circuit cloud 106 to process any other input vector. This would in turn generate a completion detection signal with the longest (worst-case) period. That speed represents the minimum overall potential speed of the circuit 100 under the then existing external conditions (e.g., power supply, temperature, etc.).

The worst-case scenario is based on a selection of an input vector which presents the most significant processing challenge to the circuit path(s) of circuit 100. A "critical path" is a circuit pathway within any particular circuit cloud 106 which has the most number of gates between the input and the output, compared to other paths in circuit 100. A "critical input vector" is an input vector designed to force the corresponding critical path to take the longest time to process as compared to any other input vector. Since a critical input vector propagating along a corresponding critical path will take the most time to process, the completion detection signals tend to generate at the slowest rate. Since the circuit will not operate any slower than this worst-case scenario, the resulting clock speed is the minimum speed of the circuit under the then existing environmental conditions.

Application of a single critical input vector to the most critical path is sufficient to obtain the minimum potential clock speed of the IC. However, there may be multiple critical paths with the same number of gates, such that each critical path would be tested with its own critical input vector and the lowest resulting clock speed would be selected. There may be multiple paths for which it is not clear whether or not one path is more critical than another, such that some or all could be tested. It may be desirable to test a group of the most critical paths (e.g., first through fourth most critical). Ultimately the number of input vectors selected and applied is up to the individual user/designer.

Selection of the critical input vector(s) that will most challenge the critical path(s) is selected using known techniques, such as critical path sensitization through SAT or any other valid delay fault test vector analysis. SAT stands through SATisfiability algorithms, which identify an input vector for a circuit such that an output function assumes the value 1. By way of non-limiting example, if a circuit has inputs a, b and c and output f, the SAT algorithm identifies an input vector for which f=1. This is related to the critical path, because once the critical path is selected it should be sensitized by deriving the combination that allows for the specific traversal of the circuit from inputs to outputs for a logic cloud. There may be several critical input vectors for a particular critical path.

Figure 2:
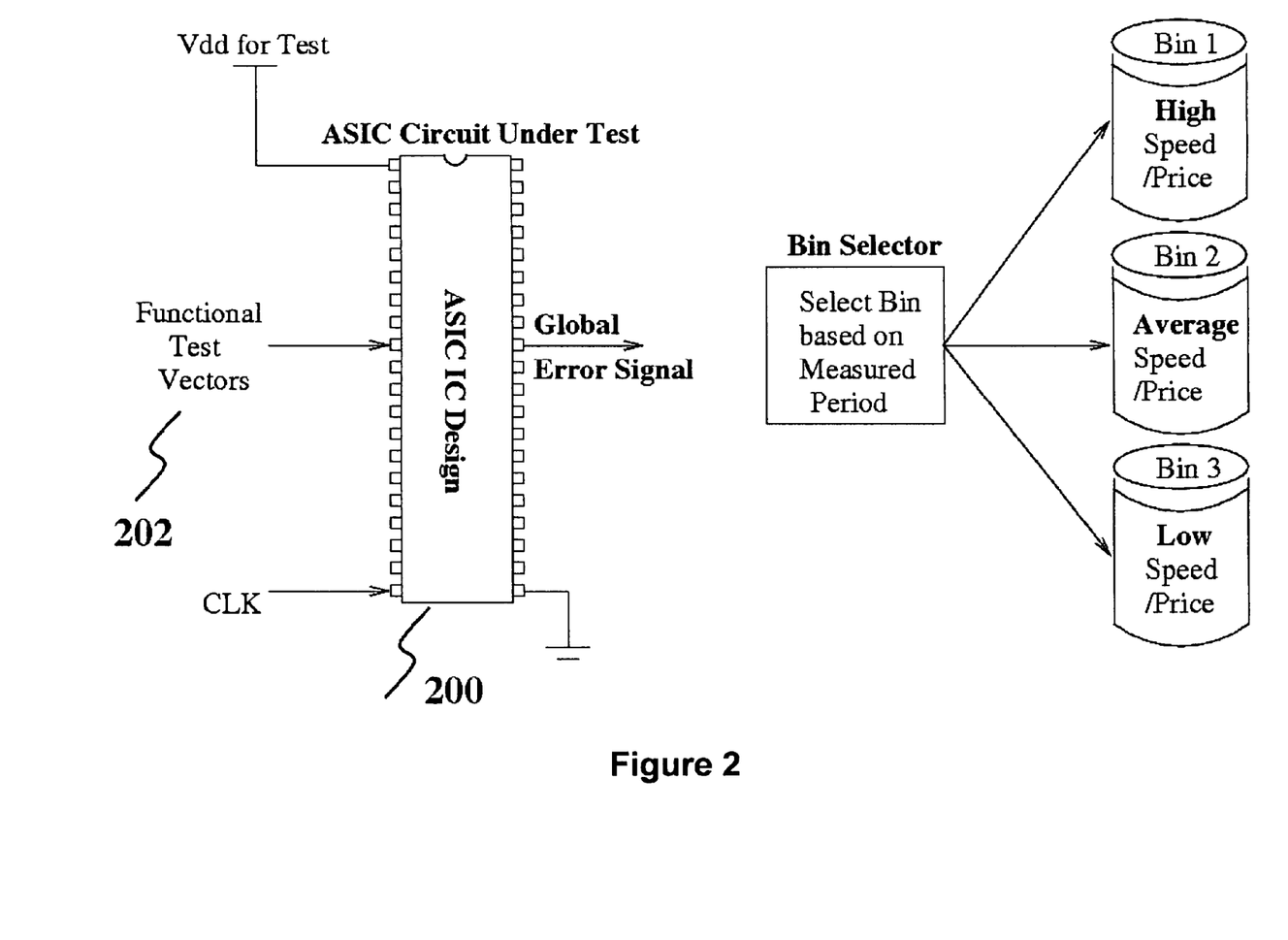
FIG. 2 illustrates applying one or more input vectors to an integrated circuit chip and monitoring the error signal output.

FIG. 2 illustrates testing an integrated circuit chip 200 with circuit 100 therein with the applied external clock speed and one or more applied input vectors 202, preferably critical input vectors. The applied clock speeds are based upon the desired settings. The chip is thus run at the speed of the highest bin to see if an error signal is generated. If no error signal is generated, then that chip is assigned to that particular speed bin. If an error signal is generated, then the circuit 100 is reset and the clock speed is lowered to the net bin threshold. The process repeats until the chip 200 is associated with its proper speed bin. FIG. 2 shows three (3) such bins, although any number may be used. The process may be manual, or automated to create a feedback to allow the system to adjust to a slower clock speed.

FIG. 2 shows integrated circuit 200 receiving an external clock signal. However, the invention is not so limited. The clock signal may be generated by one or more internal clock generators within chip 200 and/or as part of circuit 100. Any method can be used for synchronous clocking.

The circuits within circuit clouds 106 of FIG. 1 are preferably dual-rail monotonic asynchronous circuits with a two-phase, NULL, DATA discipline in which completion detection is based on the state of the primary outputs of the circuit. Applicants' co-pending application Ser. No. 11/283,070 details several methods for designing such circuits. By way of non-limiting example, FIGS. 5A-5D illustrate the transformation of Boolean logic circuit for $y=a\bar{b}+b(c+\bar{d})$ into a monotonic dual-rail circuit with completion detection that could be used for circuit cloud 106 and completion detection circuitry 108. However, the invention is not so limited, and circuit cloud 106 may be any monotonic circuit with completion detection, designed by any means. Individual circuit clouds 106 have whatever function they are designed for, and may be the same or different. A circuit is monotonic, if under certain conditions at inputs, presents monotonic transitions (rising or falling for every output) at the outputs, i.e., from one logic level to the other (say 0 to 1) without any hazards in between.

Completion detection circuitry 108 may be any circuit that detects completion, whether based on the primary outputs of circuit cloud 106, intermediate outputs within circuit cloud 106, or combinations of both. Completion detection circuitry 108 may be strongly indicating, or weakly indicating.

Circuit 100 shows a comparator 110 for each circuit cloud 106. However, the invention is not so limited. The clock signal may be generated by one or more internal clock generators within chip 200 and/or as part of circuit 100. In the alternative, comparators 100 need only be present for circuit clouds 106 which have the most critical paths. The comparators 110 may be individual circuits, a collective circuit, or combinations thereof.

Comparator 110 preferably utilizes the leadings edge of the clock signal and the completion detection signal to generate the error signal. However, trailing edges or both edges could also, so long as consistency is maintained between the two.

The running speed of circuit clouds 106 are self-adjusting for changes in the voltage of the applied power supply, or the ambient temperature of the circuit. It is well known that asynchronous circuits will process signals faster when the voltage of the power supply is increased, and slower when the power supply of the voltage is decreased. This change in rate of processing causes a corresponding change in the rate of the generation of the completion detection signals. This would not effect the circuit operation if the speed increases, but a decrease in speed could generate an error signal. These external conditions can be monitored and compensated for via a lookup table which sets appropriate clock speeds for certain combinations of environmental conditions.

Figure 4A:
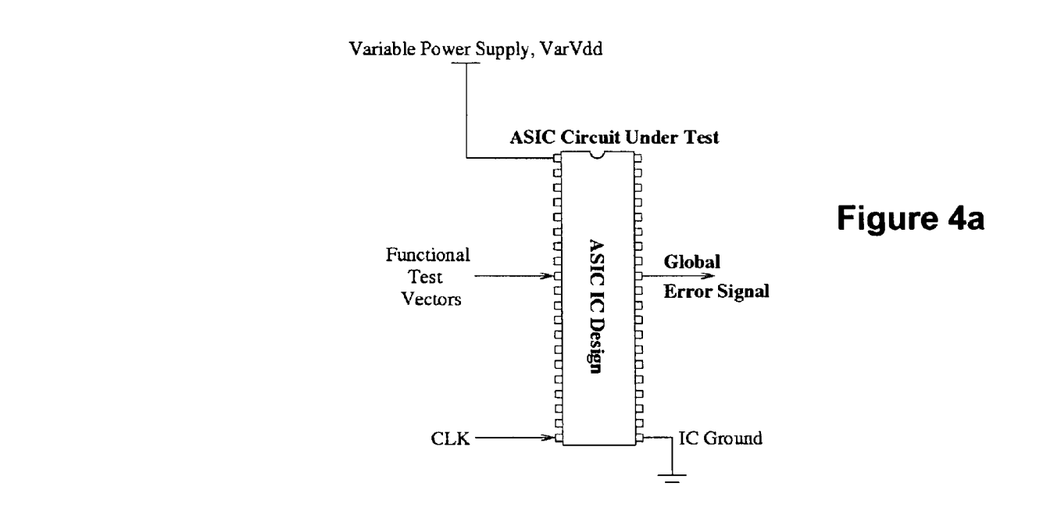
FIGS. 4A and 4B illustrate applying one or more input vectors to an integrated circuit chip and monitoring the error signal output under variable power supply conditions.
Figure 4B:
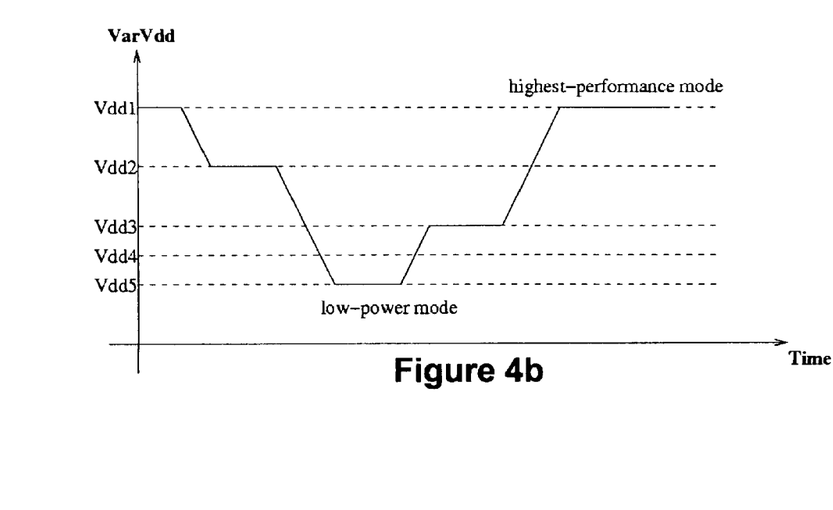
Figure 5:
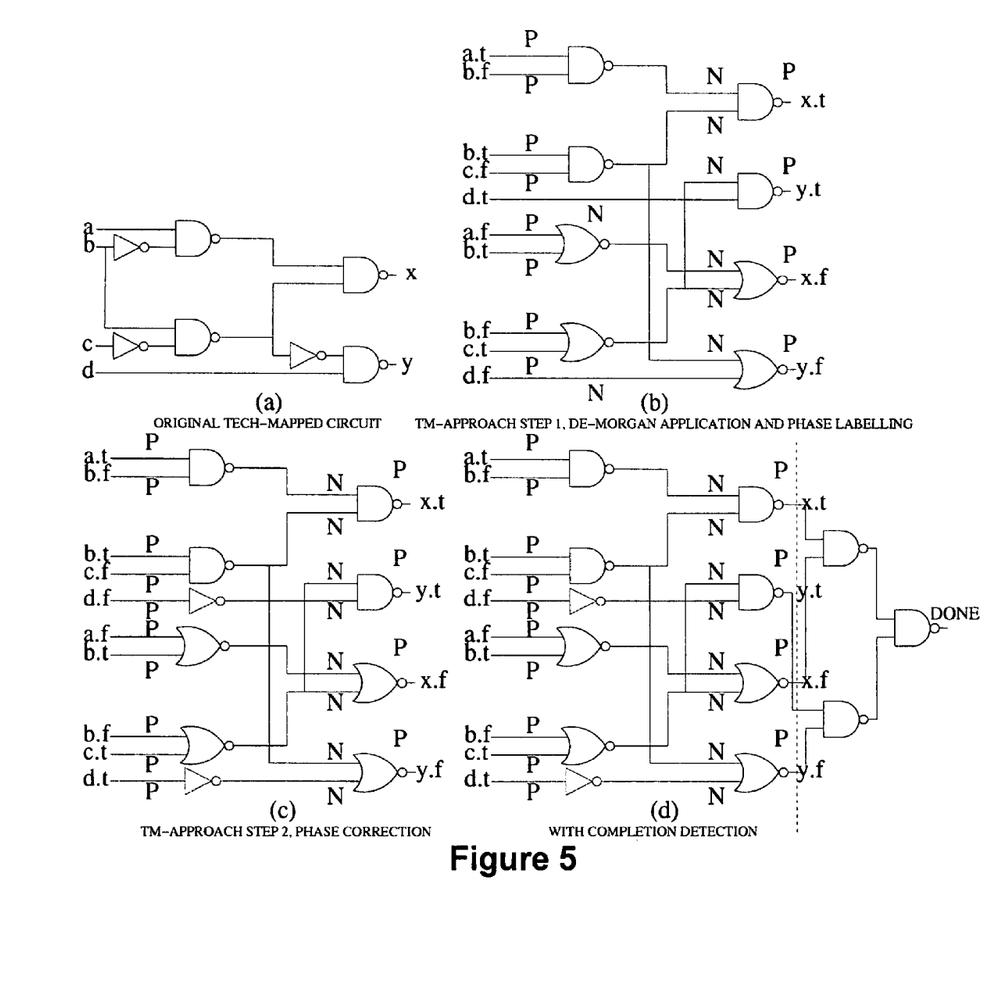
FIG. 5A-5D illustrate transformation of a Boolean logic circuit into a dual-rail circuit with completion detection.

Referring now to FIGS. 4A and 4B, the relationship between power supply voltage and processing speed allows for several useful applications. An example would be to set the power supply voltage 400 to create specific clock speeds, or vice versa, based on external conditions. The graph in FIG. 4B shows the effect of several different applied voltage levels. When speed is paramount and/or power constraints is not at issue, then the highest performance mode, i.e., the fastest speed, can be set at the highest power supply voltage level Vdd1. When speed is less necessary and/or power conservation is a concern, then the voltage can be lowered all the way down to Vdd5 to enter into a low-power mode (e.g., a standby mode). Since the speed of the chip is based on the applied clock signal, the user can ensure that the changes in power supply voltage 400 produce the desired or necessary speed for the particular mode of interest.

Another example of such an application is to ensure that an IC meets a certain minimum standards. For example, a customer may place an order for chips that operate at a certain minimum speed regardless of operating conditions, including drops in power supply voltage. While circuit 100 may meet that minimum under a nominal power supply voltage +5v, it may not be able to do so with less power. The speed of the chip can easily be tested by simply lowering the power supply voltage, applying the appropriate test vectors, and monitoring for error signals in response to particular clock speeds.

The linear pipeline structure of FIG. 1 is exemplary only. Circuit 100 may have any desired structure.

It is noted that the foregoing examples have been provided merely for the purpose of explanation and are in no way to be construed as limiting of the present invention. While the present invention has been described with reference to certain embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

By way of non-limiting example, while the above block diagrams of the above figures illustrate divisions of functionality, they should not be construed as divisions in layout. It is well known in the art of circuit design and construction that circuit elements from different functional sub-blocks can be integrated and laid out as needed without regards for functional distinctions. Thus for example, there may appear to be a single large circuit, even though various individual circuit elements are working collectively for their individual functions.

What is claimed is:
1. A method for determining a minimum running speed of an integrated circuit containing first logic elements configured to process inputs, and second logic elements configured to determine whether the first logic elements have completed their processing; comprising:

identifying at least one critical path in the first logic elements of the integrated circuit;

selecting at least one critical test vector for each of said at least one critical path;

inputting said at least one critical test vector to the first logic elements of said integrated circuit under ambient conditions; and applying at least one clock speed for each of the at least one critical input vector applied during said inputting;

monitoring, during said applying, the integrated circuit for the presence of an error signal, the error signal being based on the at least one clock speed and output of the second logic elements; and identifying the fastest individual clock speed from said at least one clock speed that did not generate the error signal during said monitoring.

2. The method of claim 1, further comprising modifying the ambient external conditions to thereby change the speed of the integrated circuit.

3. The method of claim 2, wherein said modifying comprises changing the voltage of the power supply applied to said circuit.

4. The method of claim 2, wherein said modifying comprises changing the temperature of said circuit.

5. The method of claim 1, further comprising:

establishing a plurality of speed ranges;

comparing the fastest individual clock speed of the circuit with the plurality of speed ranges to identify a corresponding speed range; and sorting the circuit based on the corresponding speed range identified by said comparing.

6. The method of claim 1, wherein said monitoring indicates whether a particular clock signal is too fast for the integrated circuit because it arrived at comparison circuitry before the output of the second logic elements.

7. The method of claim 1, wherein said monitoring further comprises comparing the at least one clock signal with a minimum time.

8. The method of claim 7, wherein said monitoring indicates whether a particular clock signal is too fast for the integrated circuit because it arrived at comparison circuitry before either the minimum time or the output of the second logic elements.

9. The method of claim 7, wherein said comparing the at least one clock signal with a minimum time comprises comparing an active edge of the at least one clock signal with a minimum time.

10. The method of claim 7, further comprising a flip flop adjacent the first and second logic elements, the minimum time corresponding to a set-up time of the flip-flop.

11. The method of claim 1, wherein said monitoring comprises comparing an active edge of the at least one clock signal with at least an output of the second logic elements.

12. A method for determining a minimum running speed of an integrated circuit containing first logic elements configured to process inputs, and second logic elements configured to determine whether the first logic elements have completed their processing; comprising:

identifying at least one critical path in the integrated circuit;

selecting at least one critical test vector for each of said at least one critical path;

inputting said at least one critical test vector to said circuit under ambient conditions;

applying at least one clock speed for each of the at least one critical input vector applied during said inputting;

comparing the at least one clock signal with at least a minimum time and an output of the second logic elements; and identifying, based on the comparing, the fastest viable individual clock speed from the at least one clock speed.

13. The method of claim 12, wherein said comparing comprises comparing an active edge of the at least one clock signal with at least a minimum time and an output of the second logic elements.

14. The method of claim 12, wherein said comparing the at least one clock signal with a minimum time comprises comparing an active edge of the at least one clock signal with a minimum time.

15. The method of claim 14, further comprising a flip flop adjacent the first and second logic elements, the minimum time corresponding to a set-up time of the flip-flop.

* * * * *